(12) United States Patent
Chen et al.

(10) Patent No.: US 9,577,146 B2
(45) Date of Patent: Feb. 21, 2017

(54) LIGHT-EMITTING ELEMENT

(71) Applicant: EPISTAR CORPORATION, Hsinchu (TW)

(72) Inventors: Po Yuan Chen, Hsinchu (TW); Wen Ming Tsao, Hsinchu (TW); Chih Chun Ke, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/695,131

(22) Filed: Apr. 24, 2015

(65) Prior Publication Data

US 2016/0315221 A1    Oct. 27, 2016

(51) Int. Cl.
| | |
|---|---|
| *H01L 33/14* | (2010.01) |
| *H01L 33/32* | (2010.01) |
| *H01L 33/06* | (2010.01) |
| *H01L 33/30* | (2010.01) |

(52) U.S. Cl.
CPC .............. *H01L 33/14* (2013.01); *H01L 33/06* (2013.01); *H01L 33/145* (2013.01); *H01L 33/30* (2013.01); *H01L 33/32* (2013.01); *H01L 33/325* (2013.01)

(58) Field of Classification Search
None
See application file for complete search history.

(56) References Cited

U.S. PATENT DOCUMENTS

| | | | |
|---|---|---|---|
| 5,048,035 A * | 9/1991 | Sugawara | B82Y 20/00 257/94 |
| 2013/0292645 A1* | 11/2013 | Yun | H01L 33/14 257/13 |

\* cited by examiner

*Primary Examiner* — Fei Fei Yeung Lopez
(74) *Attorney, Agent, or Firm* — Patterson + Sheridan, LLP

(57) ABSTRACT

A light-emitting element comprises: a first semiconductor stack having a first conductivity type; an active layer formed on the first semiconductor stack; a second semiconductor stack having a second conductivity type formed on the active layer; and a first current-spreading layer having the first conductivity type interposed in the second semiconductor stack.

20 Claims, 6 Drawing Sheets

LIGHT-EMITTING ELEMENT

TECHNICAL FIELD

The application relates to a light-emitting element, in particular, relates to a light-emitting element having a current-spreading layer in the epitaxial structure thereof.

DESCRIPTION OF BACKGROUND ART

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as another option of the light source for the illumination markets. The LED applies to various applications like the traffic signal, backlight module, street light, and medical instruments, and is gradually replacing the traditional lighting sources.

A light-emitting device may include a substrate, a light-emitting stack including an n-type semiconductor layer, an active layer and a p-type semiconductor layer. The n-type semiconductor layer provides electrons and the p-type semiconductor layer provides holes, and electrons and holes can be recombined in the active layer.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A light-emitting element comprises: a first semiconductor stack having a first conductivity type; an active layer formed on the first semiconductor stack; a second semiconductor stack having a second conductivity type formed on the active layer; and a first current-spreading layer having the first conductivity type interposed in the second semiconductor stack.

A light-emitting element comprising: a semiconductor light-emitting stack; a p-type semiconductor stack formed in the semiconductor light-emitting stack; and a current-spreading layer comprising an undoped layer interposed in the p-type semiconductor stack.

DETAILED DESCRIPTION OF PREFERRED EMBODIMENTS

Figure 1A:
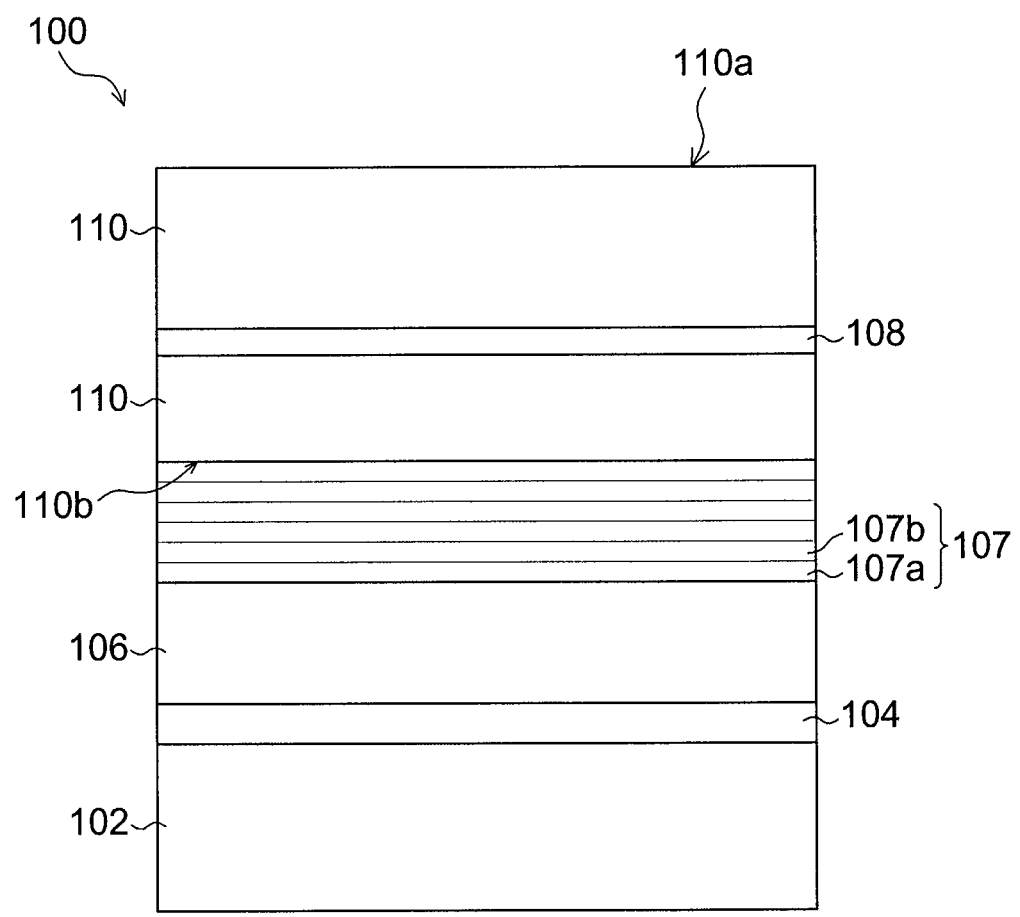
FIG. 1A shows a schematic structure of a light-emitting element in accordance with a first embodiment of the present application.

As shown in FIG. 1A, a light-emitting element in accordance with a first embodiment of the present application is disclosed. The light-emitting element 100 can be an LED or a laser. In the embodiment the light-emitting element 100 is an LED. The light-emitting element 100 comprises: a substrate 102; a buffer layer 104 formed on the substrate 102; a first semiconductor stack 106 having a dominant first conductivity type formed on the buffer layer 104; an active layer 107 formed on the first semiconductor stack 106; and a second semiconductor stack 110 having a dominant second conductivity type formed on the active layer 107. An electrical power can be supplied to the light-emitting element 100 and transformed to be light in the active layer 107. For some purposes such as epitaxial quality or electrical effect, the first semiconductor stack 106 and the second semiconductor stack 110 may comprise undoped or un-intentionally doped layers or layers with opposite conductivity, respectively. The first conductivity type of the first semiconductor stack 106 can be n-type therefore the first semiconductor stack 106 can provide electrons, and the second conductivity type of the second semiconductor stack 110 can be p-type therefore the second semiconductor stack 110 can provide holes, and the holes and electrons can combine in the active layer 107 for generating the light. A current-spreading layer 108 can be interposed in the second semiconductor stack 110. The current-spreading layer 108 can be undoped or un-intentionally doped with n-type impurity, for example, Si doped not greater than $1E17$ $cm^{-3}$, and comprises a thickness between 15 Å and 40 Å. In another embodiment, the current-spreading layer 108 can be intentionally doped with the impurity of the first conductivity type such as n-type impurity, for example, Si in an impurity concentration between $1E17$ and $1E20$ $cm^{-3}$, and comprises a thickness between 50 Å and 100 Å, in specific, the current-spreading layer 108 can be intentionally doped with Si in impurity concentration $1E18$ $cm^{-3}$-$8E19$ $cm^{-3}$, and the thickness thereof can be 60 Å. Accordingly, the current-spreading layer 108 comprises a higher resistance for holes than the second semiconductor stack 110, the holes from the second semiconductor stack 110 toward the active layer 107 can be slightly blocked by the current-spreading layer 108. The current-spreading layer 108 is under a thickness such that the holes can widely spread via the current-spreading layer 108 blocking before reaching the active layer 107 and pass through the current-spreading layer 108 to the active layer 107. The light-emitting element 100 can comprise a nitride-based semiconductor light-emitting device. The substrate 102 can comprise insulating material, such as sapphire, diamond or glass, or semiconductor material, such as Si, $Ga_2O_3$, AlN or GaN. The buffer layer 104 can comprise AlN, GaN or AlGaN. The first semiconductor stack 106 and the second semiconductor stack 110 can comprise $Al_yGa_{1-y}N$, wherein $0 \leq y \leq 1$. The current-spreading layer 108 can be an undoped GaN or $Al_xGa_{1-x}N$, wherein x is between 0.1 and 0.2. The current-spreading layer 108 also can be an un-intentionally doped GaN or $Al_xGa_{1-x}N$ doped with n-type impurity, for example Si, in an impurity concentration not greater than $1E17$ $cm^{-3}$. The current-spreading layer 108 also can be a GaN layer intentionally doped with the n-type impurity. In the embodiment, the n-type impurity is Si, and the impurity concentration is between 1E17 cm$^{-3}$ and 1E20 cm$^{-3}$, in specific, the impurity concentration of Si can be between 1E18 cm$^{-3}$ and 8E19 cm$^{-3}$.

The second semiconductor stack 110 comprises an upper side 110a and a bottom side 110b closer to the active layer 107 than the upper side 110a, and the current-spreading layer 108 is closer to the bottom side 110b than the upper side 110a. Therefore the holes generated by the second semiconductor stack 110 can be spread via the current-spreading layer 108 efficiently. The second semiconductor stack 110 can be doped with the second type impurity such as p-type impurity, Mg.

Figure 1B:
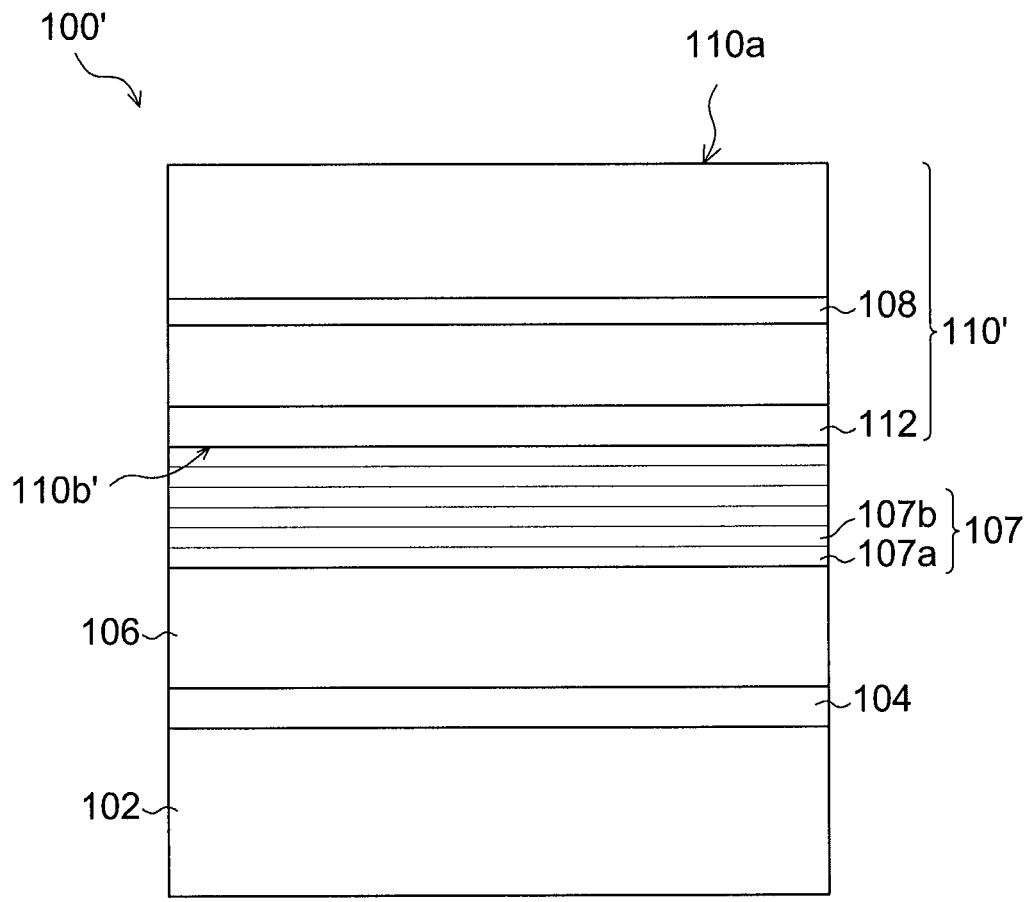
FIG. 1B shows a schematic structure of a light-emitting element in accordance with a second embodiment of the present application.

As shown in FIG. 1B, a light-emitting element 100' in accordance with a second embodiment of the present application is disclosed. A second semiconductor stack 110' can comprise an upper side 110a and a bottom side 110b' closer to the active layer 107 than the upper side 110a, in comparison with the second semiconductor stack 110 of the first embodiment, the second semiconductor stack 110' further comprises an electron-blocking layer 112 formed between the active layer 107 and the current-spreading layer 108. The electron-blocking layer 112 can be a AlGaN doped with an impurity of the second conductivity type such as p-type impurity, Mg. In another embodiment, the electron-blocking layer 112 can be an undoped AlGaN. The p-type AlGaN electron-blocking layer 112 can have a Al composition between 15% and 25% and higher than the Al composition of the current spreading layer 108 comprising undoped AlGaN.

The first semiconductor stack 106 can be intentionally or un-intentionally doped with the first conductivity type impurity such as n-type impurity, Si. The active layer 107 can comprise multi-quantum well (MQW) structure comprising alternatively staked wells 107a and barriers 107b, in addition, the active layer 107 can also comprise a single heterostructure (SH), a double heterostructure (DH) or a double-side double heterostructure (DDH). Additionally, a portion of the second semiconductor stack 110 and the active layer 107 can be removed to expose a surface of the first semiconductor stack 106, and two electrodes can be formed on the second semiconductor stack 110 and the first semiconductor stack 106, respectively, for receiving current from a power source (not shown).

Figure 2A:
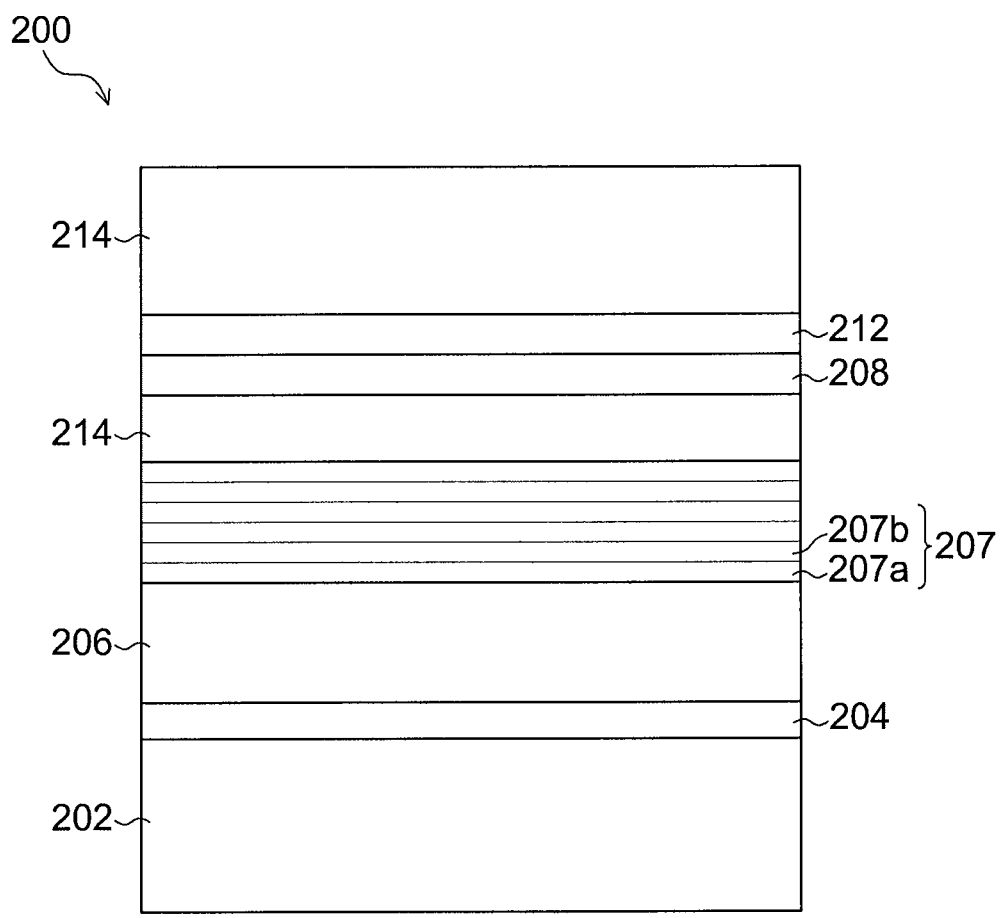
FIG. 2A shows a schematic structure of a light-emitting element in accordance with a third embodiment of the present application.

As shown in FIG. 2A, a light-emitting element in accordance with a third embodiment of the present application is disclosed. The light-emitting element 200 can be an LED or a laser. In the embodiment the light-emitting element 100 is an LED. The light-emitting element 200 comprises: a substrate 202; a buffer layer 204 formed on the substrate 202; a first semiconductor stack 206 having a dominant first conductivity type formed on the buffer layer 204; an active layer 207 formed on the first semiconductor stack 206; and a second semiconductor stack 214 having a dominant second conductivity type formed on the active layer 207. An electrical power can be supplied to the light-emitting element 200 and transformed to be light in the active layer 207. The first conductivity type of the first semiconductor stack 206 can be n-type therefore the first semiconductor stack 206 can provide electrons, and the second conductivity type of the second semiconductor stack 214 can be p-type therefore the second semiconductor stack 214 can provide holes, and the holes and electrons can combine in the active layer 207 for generating the light. A first current-spreading layer 208 and a second current-spreading layer 212 adjacent to the first current-spreading layer 208 can be interposed in the second semiconductor stack 214. The first current-spreading layer 208 can be intentionally doped with Si to be the first conductivity type such as n-type, and comprises a thickness between 50 Å and 100 Å. The second current-spreading layer 212 can be undoped or un-intentionally doped and comprises a thickness between 15 Å and 40 Å. In the embodiment the second current-spreading layer 212 is above the first current-spreading layer 208, however locations of the first current-spreading layer 208 and the second current-spreading layer 212 can be exchanged that the first current-spreading layer 208 can be above the second current-spreading layer 212. Similar to the first embodiment, the light-emitting element 200 can comprise a nitride-based semiconductor light-emitting device, the second current-spreading layer 212 can be an undoped or un-intentionally doped GaN or Al$_x$Ga$_{1-x}$N, wherein 0.1≤x≤0.2, and the first current-spreading layer 208 also can be a GaN layer intentionally doped with the impurity of the first conductivity type such as n-type impurity, for example Si, in an impurity concentration between 1E17 cm$^{-3}$ and 1E20 cm$^{-3}$, in specific, between 1E18 cm$^{-3}$ and 8E19 cm$^{-3}$. The active layer 207 can comprise a multi-quantum well (MQW) structure comprising alternatively staked wells 207a and barriers 207b, a single heterostructure (SH), a double heterostructure (DH) or a double-side double heterostructure (DDH).

Figure 2B:
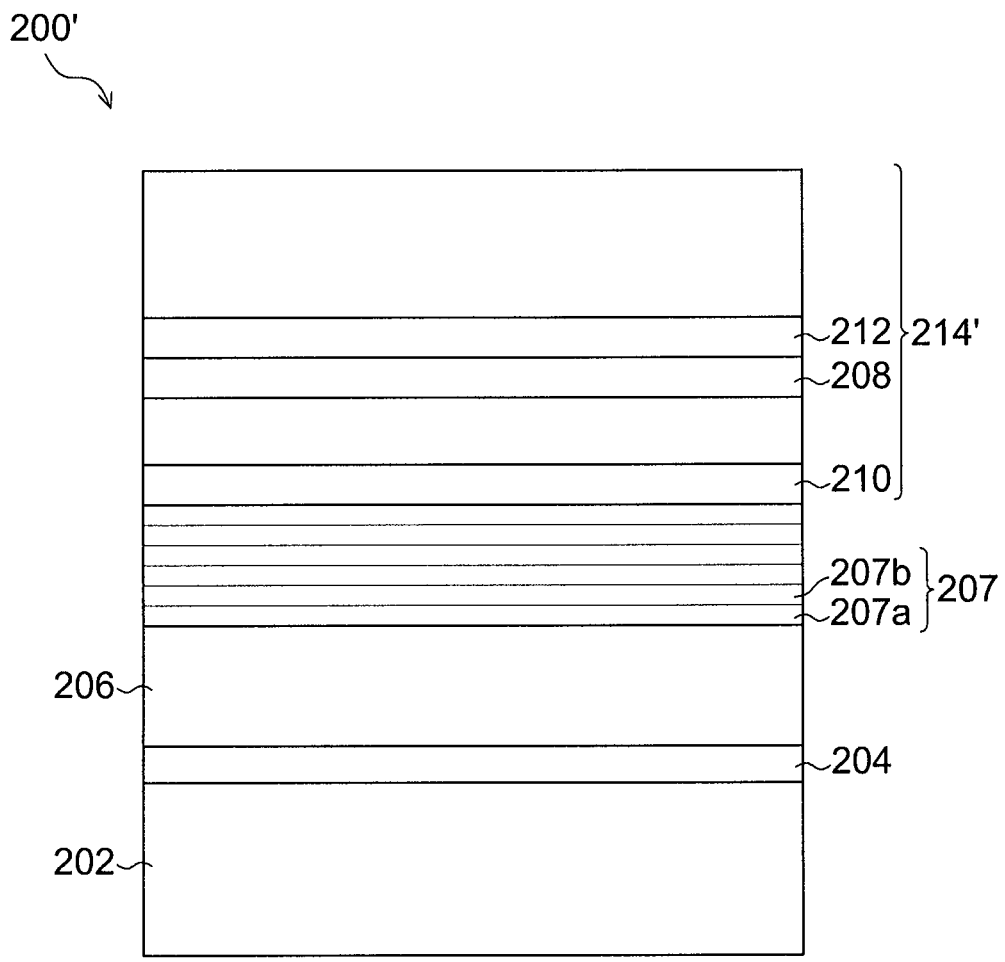
FIG. 2B shows a schematic structure of a light-emitting element in accordance with a fourth embodiment of the present application.

As shown in FIG. 2B, a light-emitting element 200' in accordance with a fourth embodiment of the present application is disclosed. Similar to the first embodiment, a second semiconductor stack 214 can further comprise an electron-blocking layer 210 between the active layer 207 and the first current spreading layer 208, and the electron-blocking layer 210 can comprise AlGaN doped with the second conductivity type impurity, such as p-type impurity Mg, or undoped AlGaN. Accordingly, the light-emitting element 200' of the embodiment comprises the second semiconductor stack 214 having the electron-blocking layer 210, and the first current spreading layer 208 and the second current spreading layer 212 are above the electron-blocking layer 210.

Figure 3A:
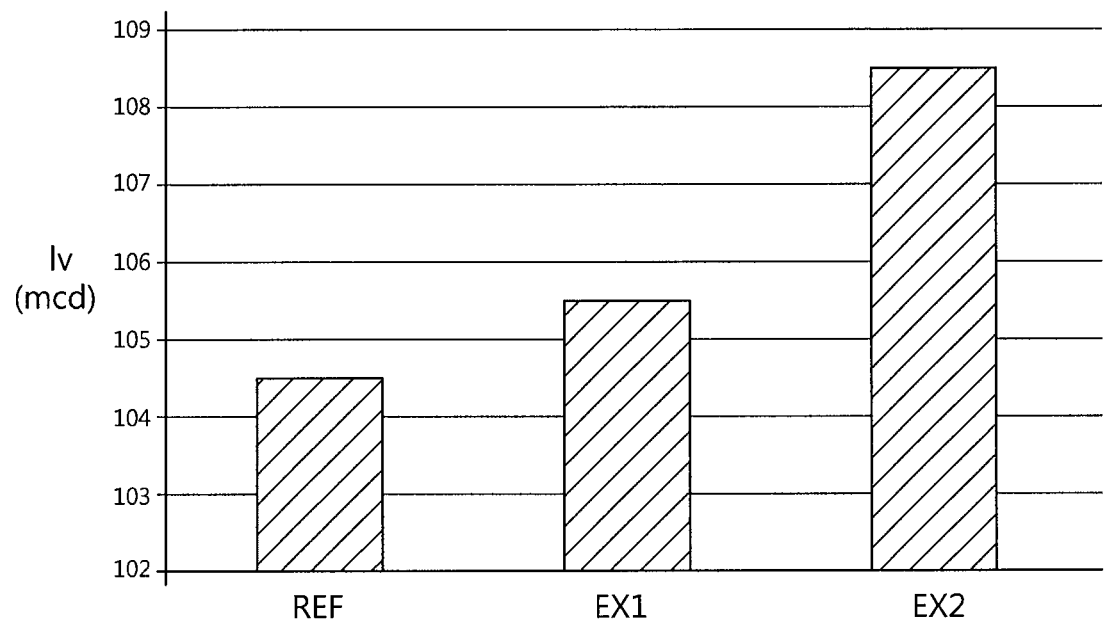
FIGS. 3A to 3C show experimental diagrams of the present application.

Referring to FIG. 3A, it illustrates a diagram of luminous intensity (Iv) versus different light-emitting elements comprising a conventional light-emitting element and the embodiments of the present application. The dominant wavelength of these light-emitting elements is at a blue light wavelength between 450 nm and 454 nm. As shown in FIG. 3A, the conventional light-emitting element, the light-emitting element corresponding to the second embodiment and the light-emitting element corresponding to the fourth embodiment are marked as Ref, EX1 and EX2 respectively. The light-emitting element EX1 comprises a p-AlGaN electron-blocking layer 112 having an Al composition between 15% and 25% and an undoped GaN current-spreading layer 108. The light-emitting element EX2 comprises a p-AlGaN electron-blocking layer 210 having an Al composition between 15% and 25%, an undoped GaN first current spreading layer 212 and an n-GaN second current spreading layer 208. According to FIG. 3A, under the light-emitting wavelength range (450 nm-454 nm), luminous intensity of the conventional light-emitting element Ref, light-emitting elements EX1 and EX2 are 104.5 mcd, 105.5 mcd and 108.5 mcd respectively. The luminous intensity of the light-emitting elements EX1 and EX2 are higher than that of the conventional light-emitting element Ref, and the luminous intensity of the light-emitting element EX2 is higher than that of the light-emitting element EX1.

Figure 3B:
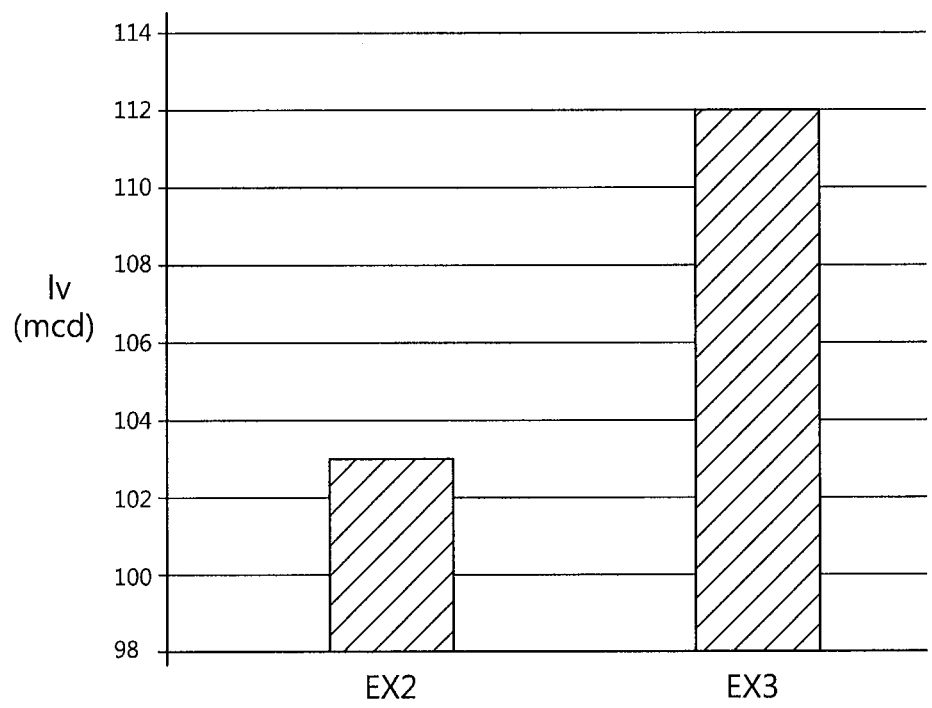

Referring to FIG. 3B, it illustrates a diagram of luminous intensity (Iv) versus different light-emitting elements of the present application. The dominant wavelength of these light-emitting elements is at a blue light wavelength between 450 nm and 454 nm. As shown in FIG. 3B, the two light-emitting elements corresponding to the fourth embodiment are marked as EX2 and EX3 respectively. The light-emitting element EX2 comprises the p-AlGaN electron-blocking layer 210 having an Al composition between 15% and 25%, the undoped GaN first current spreading layer 212 and the n-GaN second current spreading layer 208. The light-emitting element EX3 comprises a p-AlGaN electron-blocking layer 210 having an Al composition between 15% and 25%, an undoped first AlGaN current-spreading layer 208 comprising an Al composition about 10% and an n-GaN second current spreading layer 212. According to FIG. 3B, under the light-emitting wavelength range (450 nm-454 nm), the luminous intensity of the light-emitting elements EX3, 112 mcd is higher than that of the light-emitting elements EX2, 103 mcd.

Figure 3C:
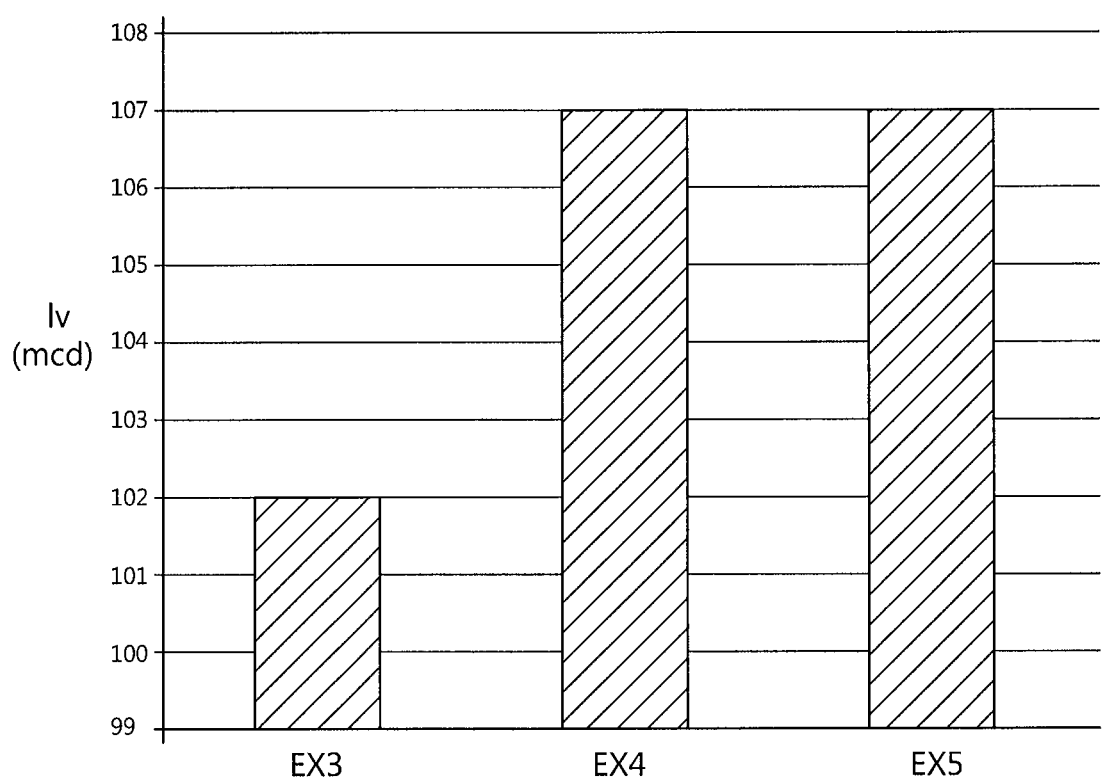

Referring to FIG. 3C, it illustrates a diagram of luminous intensity (Iv) versus different light-emitting elements of the present application. The dominant wavelength of these light-emitting elements is at a blue light wavelength between 450 nm and 454 nm. As shown in FIG. 3C, the three light-emitting elements corresponding to the fourth embodiment are marked as EX3, EX4 and EX5 respectively. The light-emitting element EX3 comprises the p-AlGaN electron-blocking layer 210 having an Al composition between 15% and 25%, the undoped first AlGaN current-spreading layer 208 having an Al composition about 10% and the n-GaN second current spreading layer 212. The light-emitting element EX4 comprises the p-AlGaN electron-blocking layer 210 having an Al composition between 15% and 20%, an undoped first AlGaN current-spreading layer 208 having an Al composition about 15% and an n-GaN second current spreading layer 212. The Al composition of the undoped first AlGaN current-spreading layer 208 is about 1.5 times of the Al composition of the undoped first AlGaN current-spreading layer 208 of the light-emitting element EX3. The light-emitting element EX5 comprises a p-AlGaN electron-blocking layer 210 having an Al composition between 15% and 25%, an undoped first AlGaN current-spreading layer 208 having an Al composition about 20% and an n-GaN second current spreading layer 212. The Al composition of the undoped first AlGaN current-spreading layer 208 is 2 times of the Al composition of the undoped first AlGaN current-spreading layer 208 of the light-emitting element EX3. According to FIG. 3C, under the light-emitting wavelength rang (450 nm-454 nm), the luminous intensity of the light-emitting elements EX3, EX4 and EX5 are 102 mcd, 107 mcd and 107 mcd, respectively. Because the light-emitting elements EX4 and EX5 have higher Al composition than the light-emitting element EX 3, the luminous intensity of the light-emitting elements EX4 and EX5 are both better than that of the light-emitting element EX 3, and the luminous intensity of the light-emitting element EX4 is substantially equal to that of the light-emitting element EX5.

In conventional, a nitride-based semiconductor light-emitting device has an issue current injected from an electrode into the nitride-based semiconductor light-emitting device will be crowded in a p-type semiconductor layer under the electrode, and a method for solving such problem comprises forming a transparent conductive layer on the P-type semiconductor layer, in some devices, one or more metal extensions can be further formed on the transparent conductive layer, however the metal extensions may block or absorb light emitted from an active layer. In accordance with the present application, the current-spreading layer interposed in the P-type semiconductor layer can effectively enhance current-spreading of a nitride-based semiconductor light-emitting device, therefore there is no need to arrange too much metal extensions on the transparent conductive layer to solve the light absorbed by the metal extensions.

Although the present application has been explained above, it is not the limitation of the range, the sequence in practice, the material in practice, or the method in practice. Any modification or decoration for present application is not detached from the spirit and the range of such.

What is claimed is:
1. A light-emitting element comprising:
a first semiconductor stack having a first conductivity type;
an active layer formed on the first semiconductor stack;
a second semiconductor stack having a second conductivity type formed on the active layer; and
a first current-spreading layer having the first conductivity type interposed in the second semiconductor stack;
wherein the second semiconductor stack comprises an electron-blocking layer formed between the active layer and the first current-spreading layer.

2. The light-emitting element according to claim 1, wherein the first semiconductor stack, the active layer and the second semiconductor stack comprise nitride based semiconductor, and the first conductivity type comprises n-type, and the second conductivity type comprises p type.

3. The light-emitting element according to claim 2, wherein the first conductivity type of the first current-spreading layer comprises intentionally doped n-type or un-intentionally doped n-type.

4. The light-emitting element according to claim 2, wherein the first current-spreading layer comprises an n-type GaN layer and/or the first current-spreading layer comprises a higher resistance for holes than the second semiconductor stack.

5. The light-emitting element according to claim 2, further comprising a second current-spreading layer, being undoped or un-intentionally doped and adjacent to the first current-spreading layer, and interposed in the second semiconductor stack.

6. The light-emitting element according to claim 5, wherein the second current-spreading layer comprises GaN or AlGaN.

7. The light-emitting element according to claim 5, wherein the second current-spreading layer comprises a thickness between 15 Å and 40 Å.

8. The light-emitting element according to claim 5, wherein the second current-spreading layer is closer to the active layer than the first current-spreading layer.

9. The light-emitting element according to claim 5, wherein the second current-spreading layer has an Al composition between 10% and 20%.

10. The light-emitting element according to claim 1, wherein the first current-spreading layer comprises a thickness between 50 Å and 100 Å.

11. The light-emitting element according to claim 1, wherein the second semiconductor stack comprises an upper side and a bottom side closer to the active layer than the upper side, and the first current-spreading layer is closer to the bottom side than the upper side.

12. A light-emitting element comprising:
a semiconductor light-emitting stack;
a p-type semiconductor stack formed in the semiconductor light-emitting stack; and a first current-spreading layer comprising an undoped layer interposed in the p-type semiconductor stack; wherein the undoped layer comprises an un-intentionally doped layer.

13. The light-emitting element according to claim 12, wherein the semiconductor light-emitting stack comprises an n-type semiconductor stack, an active layer formed on the n-type semiconductor stack and the p-type semiconductor stack formed on the active layer.

14. The light-emitting element according to claim 12, wherein the first current-spreading layer comprises GaN or $Al_xGa_{1-x}N$, and x is between 0.1 and 0.2 and/or the first current-spreading layer comprises a thickness between 15 Å and 40 Å or between 50 Å and 100 Å.

15. The light-emitting element according to claim 13, wherein the p-type semiconductor stack comprises an electron-blocking layer formed between the active layer and the first current-spreading layer.

16. The light-emitting element according to claim 15, wherein the electron-blocking layer comprises AlGaN and the first current-spreading layer comprises AlGaN, and an Al composition of the electron-blocking layer is higher than that of the first current-spreading layer.

17. The light-emitting element according to claim 13, further comprising a second current-spreading layer, being undoped or un-intentionally doped and adjacent to the first current-spreading layer, and interposed in the p-type semiconductor stack.

18. The light-emitting element according to claim 17, wherein the second current-spreading layer comprises GaN or AlGaN.

19. The light-emitting element according to claim 17, wherein the second current-spreading layer is closer to the active layer than the first current-spreading layer.

20. The light-emitting element according to claim 13, wherein the p-type semiconductor stack comprises an upper side and a bottom side closer to the active layer than the upper side, and the first current-spreading layer is closer to the bottom side than the upper side.

* * * * *